(12) United States Patent
Andideh et al.

(10) Patent No.: US 7,184,289 B2
(45) Date of Patent: Feb. 27, 2007

(54) PARALLEL ELECTRODE MEMORY

(75) Inventors: Ebrahim Andideh, Porland, OR (US); Richard L. Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 10/712,205

(22) Filed: Nov. 12, 2003

(65) Prior Publication Data

US 2005/0099878 A1    May 12, 2005

(51) Int. Cl.
*G11C 5/02* (2006.01)
*G11C 5/06* (2006.01)
*G11C 11/22* (2006.01)

(52) U.S. Cl. ............... 365/51; 365/63; 365/65; 365/145; 365/163

(58) Field of Classification Search ............ 365/51, 365/63, 65, 145, 130, 163, 117, 113, 109
See application file for complete search history.

(56) References Cited

U.S. PATENT DOCUMENTS

| | | | | |
|---|---|---|---|---|
| 5,448,110 A | * | 9/1995 | Tuttle et al. ............... | 257/723 |
| 5,969,380 A | * | 10/1999 | Seyyedy .................... | 257/295 |
| 6,055,180 A | | 4/2000 | Gudesen et al. ............ | 365/175 |
| 2003/0185048 A1 | * | 10/2003 | Fricke et al. ............... | 365/170 |

FOREIGN PATENT DOCUMENTS

EP    0073486 A2   *   3/1983

* cited by examiner

*Primary Examiner*—J. H. Hur
(74) *Attorney, Agent, or Firm*—Trop, Pruner & Hu, P.C.

(57) ABSTRACT

A series of address lines extend in a first direction through at least two layers of memory material spaced apart in the first direction. The memory material may be a ferroelectric polymer in one embodiment. The arrangement of lines and layers may increase the density of a memory in one embodiment.

36 Claims, 5 Drawing Sheets

PARALLEL ELECTRODE MEMORY

BACKGROUND

This invention relates generally to memories.

A ferroelectric polymer memory may be used to store data. Data may be stored in layers within the memory. The higher the number of layers, the higher the capacity of the memory. Each of the polymer layers includes polymer chains with dipole moments. Data may be stored by changing the polarization of the polymer between metal lines. No transistors may be needed for storage.

Ferroelectric polymer memories are non-volatile memories with sufficiently fast read and write speeds. For example, microsecond initial reads may be possible with write speeds comparable to those with flash memories.

Conventionally, polymer memories are formed by a layer of polymer between upper and lower parallel electrodes. Thus, successive vertically displaced sets of horizontal metal lines may be utilized to define a polymer memory cell between upper and lower lines.

The existing architecture for ferroelectric polymer memories leads to a relatively limited density. That is, the number of bits of information that can be stored within a given area is somewhat limited. Of course, the number of layers may be extended upwardly, but the more layers, the greater the overall size of the resulting structure.

Thus, it would be desirable to have alternate ways of configuring parallel electrode memories.

DETAILED DESCRIPTION

Figure 1:
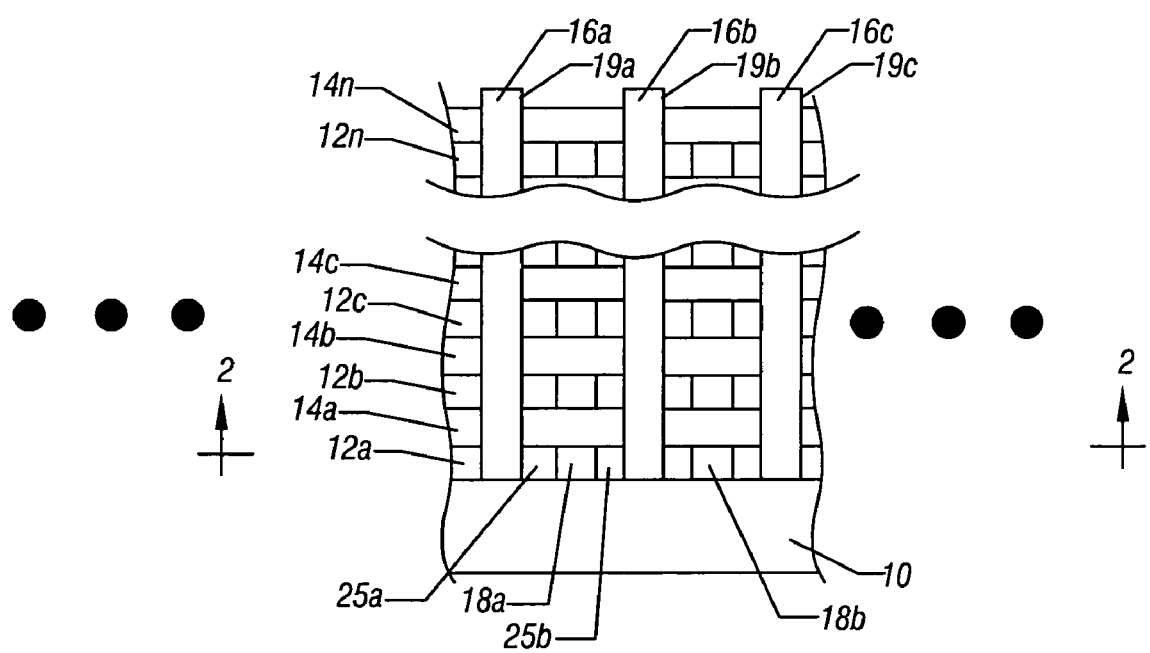
FIG. 1 is a partial, cross-sectional view of one embodiment of the present invention.

Referring to FIG. 1, a semiconductor substrate 10 may have an overlying memory material layer 12a, followed by a layer 14a of electrical insulator in one embodiment. Successive vertically spaced, memory material layers 12b–12n may have intervening dielectric layers 14b–14n in one embodiment.

While an example of a ferroelectric polymer memory is given, the present invention can apply to any parallel plate memory device. Such a device may use a memory material other than a ferroelectric polymer memory material. One example of such a material is an ovonic memory material.

A set of parallel first address lines 16 may extend vertically through the layers 12 and 14 in one embodiment. The lines 16 may be formed as metal vias in one embodiment. The lines 16a, 16b, 16c, and 16d may be horizontally equidistantly spaced from one another in one embodiment. The lines 16 may extend substantially parallel to the vertical direction or the direction of spacing of the successive layers 12.

The reference to lines is arbitrary. As used herein, "line" may simply refer to any type of addressing structure. Any references to directions of lines are also non-limiting and other directions may also be utilized.

Figure 2:
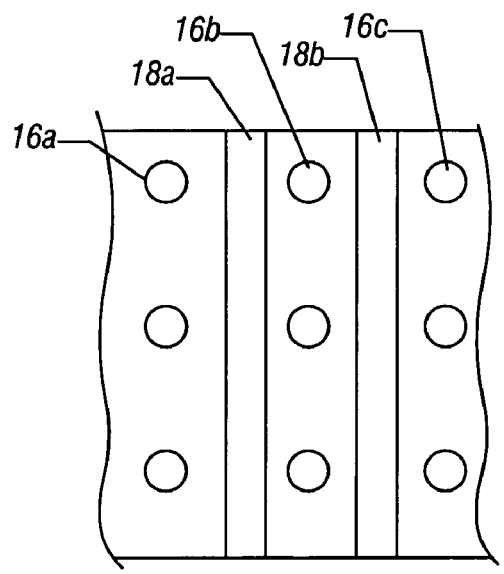
FIG. 2 is a cross-section taken generally along the lines 2—2 in FIG. 1.

A set of lines 18 may extend inwardly into the page in FIG. 1 in a direction generally transverse to the direction of the lines 16. Thus, in one embodiment, the lines 18 extend generally parallel to the upper surface of the substrate 10 and the lines 16 extend transversely thereto, as shown in FIG. 2. The lines 18 may be positioned equidistantly from one another, and equidistantly spaced from two adjacent lines 16 in one embodiment. For example, the line 18a may be equidistant between the lines 16a and 16b in one embodiment. Thus, referring to FIG. 2, the lines 18a and 18b extend transversely to the lines 16a, 16b, and 16c.

Returning to FIG. 1, an addressable cell 25 may be defined between an adjacent line 16 and an adjacent line 18. Thus, the cell 25a, shown in FIG. 1, is between the line 16a and the line 18a. Another cell 25b may be positioned between the line 18a and the adjacent line 16b. Thus, each line 18 may define, on opposed sides, a bicell structure. Each bicell may be made up of two lines 16 and one line 18 and the intervening material from the layer 12 in one embodiment.

A line 16 or 18 may be individually addressed in one embodiment of the present invention. The lines 16 may be addressed through buried contacts (not shown) within the substrate 10 in one embodiment of the present invention. As another example, an upper metallization layer, including the portions 19, may be provided to individually address the lines 16. The lines 18 may be metal layers, which may be coupled to appropriate sources of electrical potential through appropriate metallization layers in one embodiment. Thus, potentials may be applied to each line 16 or 18 to address a particular cell 25 between adjacent lines 16 and 18. The addressed cell 25 may be read or programmed by the application of appropriate currents or potentials.

Figure 3:
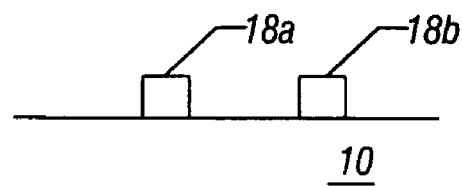
FIG. 3 is a partial, enlarged, cross-sectional view of the embodiment shown in FIG. 1 at an early stage of manufacture in accordance with one embodiment of the present invention.

The formation of a memory of the type shown in FIG. 1 may begin, as shown in FIG. 3, with a number of lines, such as the lines 18a and 18b, defined on a semiconductor substrate 10. Conventional patterning and etching techniques may be utilized to define these lines 18. In one embodiment, the lines 18 may be coupled through a metallization layer to appropriate bias potentials.

Figure 4:
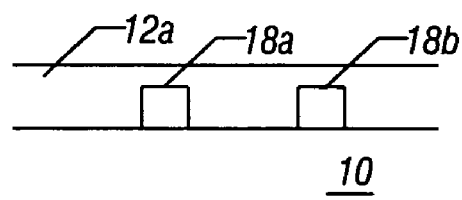
FIG. 4 is an enlarged, cross-sectional view corresponding to FIG. 3 at a subsequent stage of manufacture in accordance with one embodiment of the present invention.

Referring to FIG. 4, the lines 18 may be covered by a deposited layer 12a of memory material. In one embodiment, the memory material may be deposited to a height over the tops of the lines 18.

Figure 5:
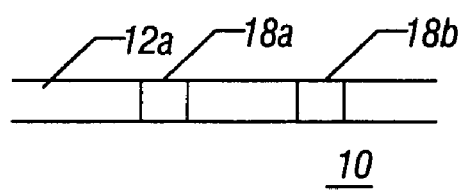
FIG. 5 is an enlarged, cross-sectional view corresponding to FIG. 4 at a subsequent stage of manufacture in accordance with one embodiment of the present invention.
Figure 6:
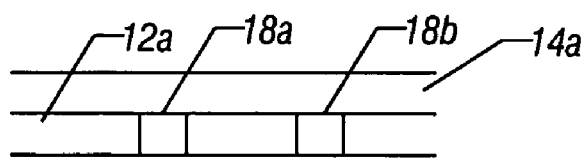
FIG. 6 is an enlarged, cross-sectional view corresponding to FIG. 5 at a subsequent stage of manufacture in accordance with one embodiment of the present invention.

Then, referring to FIG. 5, the structure shown in FIG. 4 may be etched or planarized so that the upper surface of the layer 12a is substantially coincident with the upper surfaces of the lines 18. Thereafter, an insulating layer 14*a* may be deposited or otherwise formed over the layer shown in FIG. 6.

Figure 7:
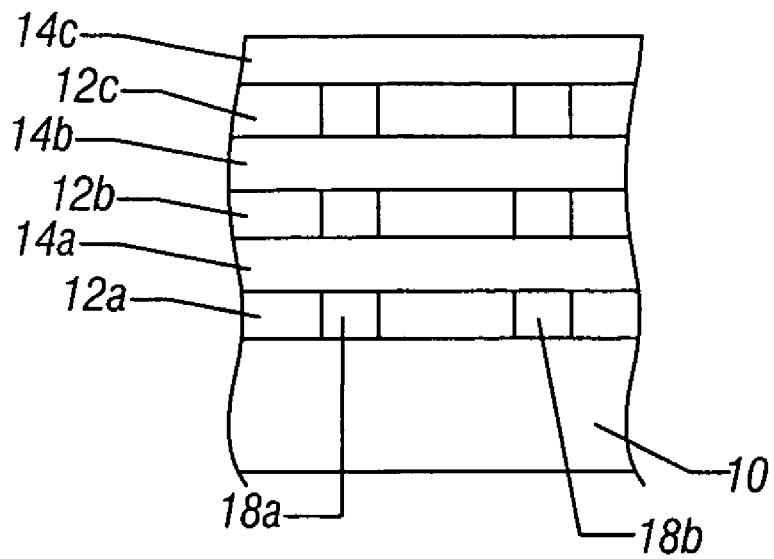
FIG. 7 is an enlarged, cross-sectional view corresponding to FIG. 6 at a subsequent stage of manufacture in accordance with one embodiment of the present invention.
Figure 8:
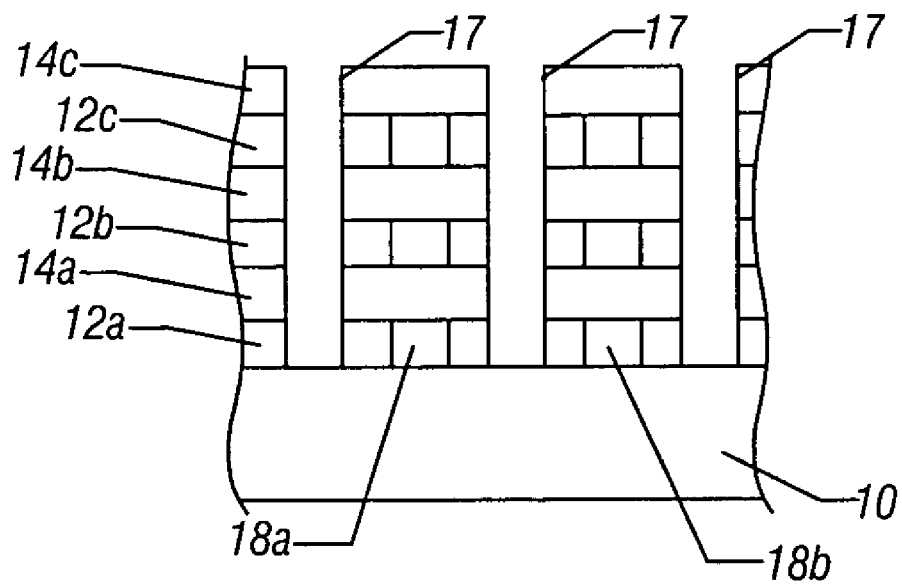
FIG. 8 is an enlarged, cross-sectional view corresponding to FIG. 7 at a subsequent stage of manufacture in accordance with one embodiment of the present invention.

Successive layers may be formed in the same fashion to form the structure shown in FIG. 7. Then, when the number of desired layers 12 and 14 has been built up, the structure shown in FIG. 7 may be subjected to via formation. The vias 17 may be formed by conventional via formation techniques extending straight downwardly between adjacent lines 18 in one embodiment. The vias 17 may thereafter be filled with conductive material, such as metal, to form the lines 16, shown in FIG. 1.

Thus, a plurality of addressable cells 25 may be defined between adjacent lines 16 and 18 in successively stacked layers 12. A plurality of cells 25 may be stacked vertically one on top of the other. In a bicell arrangement, a plurality of cells 25 may be stacked vertically one on top of the other on both sides of a given line 18.

The layers 12 can be formed of a copolymer of vinyledene fluoride (VDF) and trifluorothylene (TrFE) in one embodiment of the present invention. Then, the substrate 10 may be spin coated with the VDF/TFE copolymer in diethylcarbonate (DEC) and heated to evaporate the DEC.

Other materials can be used for the layers 12 as well, including polyethylene fluoride, copolymers, and combinations thereof, polyacrylonitriles, copolymers thereof, and combinations thereof, polyamides, copolymers thereof, and combinations thereof. The layers 14 may be formed, for example, of silicon oxide or polyimide, to mention two examples.

Of course, the number of lines 16 and 18 may be significantly greater than four as illustrated. Thus, it should be appreciated that the number of cells 25 and thus, the storage capacity of the memory, may be dramatically increased in some embodiments.

Addressing a particular cell 25 may be accomplished by applying a voltage to two adjacent lines 16 and 18 in one embodiment. For example, to address the cell 25*a*, a voltage is applied to active line 16*a* and active line 18*a*. The other, non-addressed lines 16 and 18 may be referred to as passive lines. The passive lines 16 and 18 may have a bias voltage applied to them to assure quiescent level electric fields across the cells in one embodiment. This may reduce erroneous read and writes in one embodiment.

Ferroelectric polymer memory arrays may be arranged on individual memory devices with the appropriate input and output structures, such as multiplexers, row and column address decoders, sense amplifiers and storage elements, such as buffers and registers. These memory devices may link together sequentially, acting as a larger block of memory than is available on an individual device.

Figure 9:
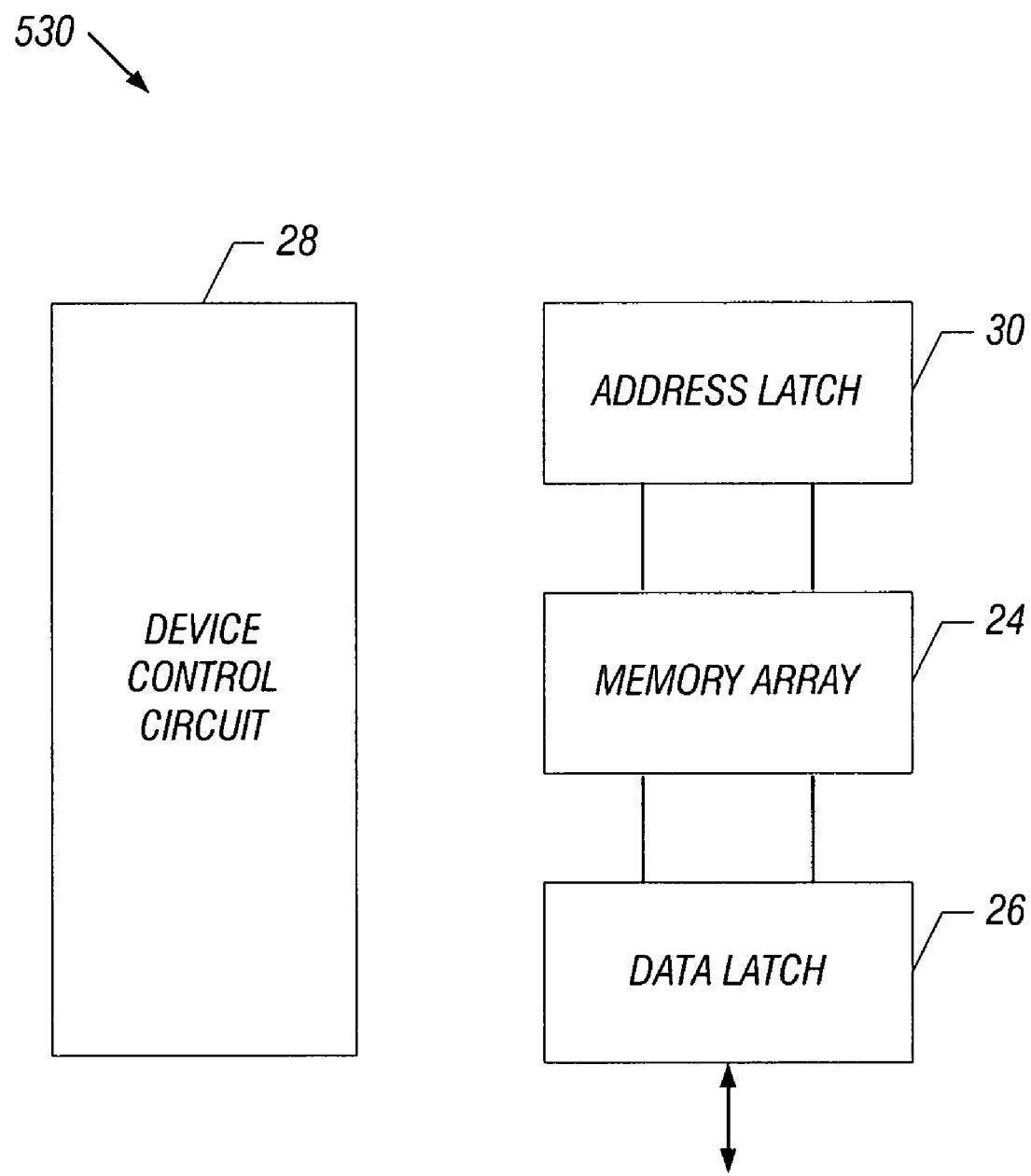
FIG. 9 is a schematic depiction of the memory of FIG. 1 in one embodiment.

A ferroelectric polymer memory 530 may include an array 24 operable to store data, as shown in FIG. 9. The array 24 is addressed through a combination of the device control circuitry 28 and the address latch 18. The address latch 18 stores address information, so the memory 530 may also be performing operations on other devices. The data latch 26 operates in a similar fashion.

The device control circuitry 28 may be one of several combinations of input and output multiplexers, row and column decoders, sense amplifiers, etc. In addition, this circuitry may receive and assert various control signals such as Serial Data In (SDI), Serial Data Out (SDO), and a busy signal. The busy signal prevents the memory 530 from accepting any other control inputs during the assertion of that signal, usually when the array 24 is performing an internal read or write. These signals also give rise to other options in designing a memory system based upon the ferroelectric memories.

For example, the ferroelectric memories are typically slower than inorganic, semiconductor-based memories. It is therefore useful to have structures on the devices that allow several memories to be operating at once, at different points in their respective processes. Two of the structures that may be used to enable simultaneous operation are the address latch 30 and the data latch 26. These structures, as well as signal controls, may allow several memories to be linked together to 'speed' up the average response time of the memories.

Figure 10:
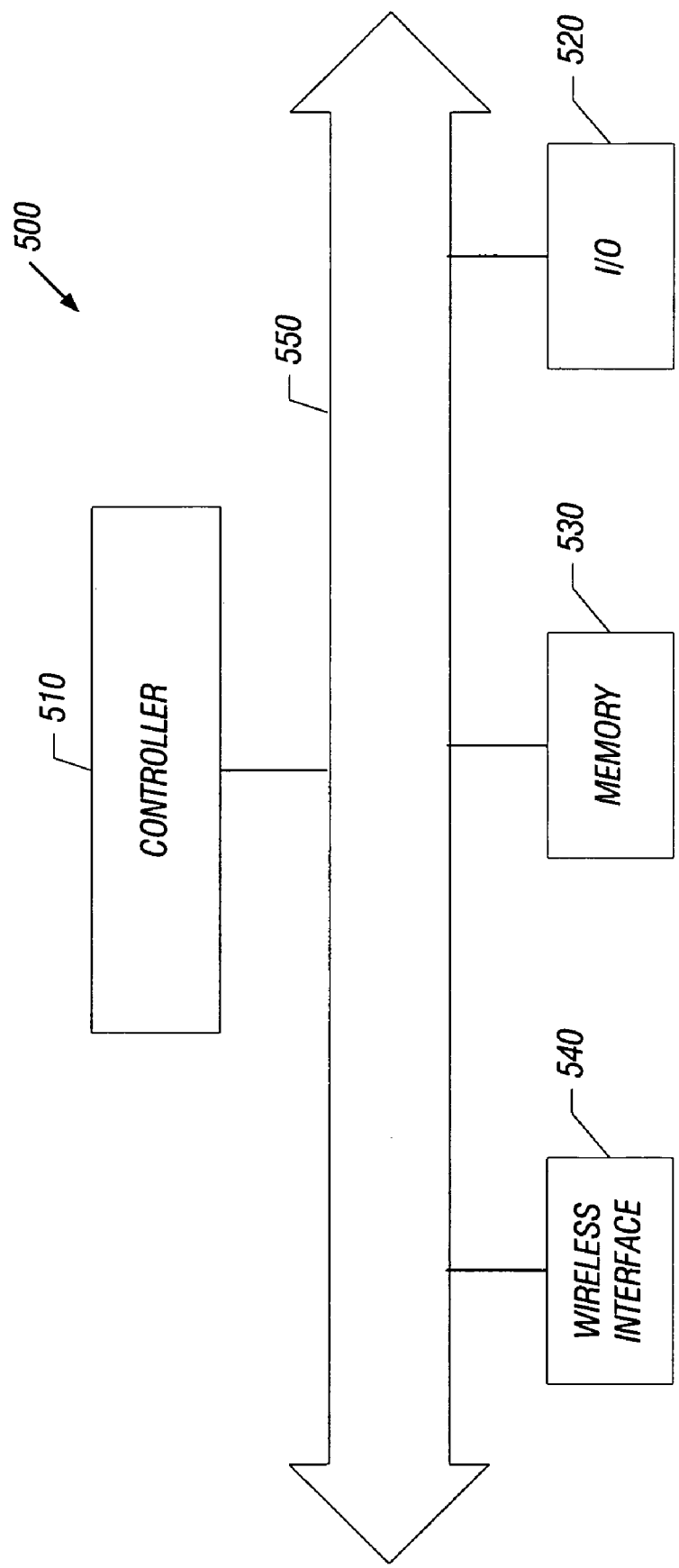
FIG. 10 is a system depiction of one embodiment of the present invention.

Turning to FIG. 10, a portion of a system 500 in accordance with an embodiment of the present invention is described. The system 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. The system 500 may be used in any of the following systems: a wireless local area network (WLAN) system, a wireless personal area network (WPAN) system, or a cellular network, although the scope of the present invention is not limited to these wireless systems or to wireless applications in general.

The system 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

The controller 510 may comprise, for example, one or more microprocessors, digital signal processors, micro-controllers, or the like. Memory 530 may be used to store messages transmitted to or by system 500. Memory 530 may also optionally be used to store instructions that are executed by the device 510 during the operation of system 500, and may be used to store user data. Memory 530 may be provided by one or more different types of memory. For example, memory 530 may comprise a volatile memory (any type of random access memory), a non-volatile memory such as a flash memory, and/or a ferroelectric polymer memory of the type illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include a wireless transceiver or an antenna, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a first layer and a second layer of memory material spaced from one another in a first direction; and
   a first address line and a second address line extending substantially in said first direction through said first and second layers.

2. The memory of claim 1 wherein said memory material includes a ferroelectric polymer material.

3. The memory of claim 1 including third and fourth address lines which extend in a second direction different from said first direction.

4. The memory of claim 3 wherein said first and second directions are substantially transverse to one another.

5. The memory of claim 3 wherein said third and fourth address lines are in said first layer.

6. The memory of claim 5 including a first cell formed in said first layer between said first and third address lines and a second cell formed in said first layer between said second and fourth address lines.

7. The memory of claim 6 wherein a bicell of two cells is formed in said first layer on opposed sides of said third address line.

8. The memory of claim 7 wherein said bicell is formed between said first and second address lines, and wherein said bicell includes said third address line.

9. The memory of claim 1 having more than two lines.

10. The memory of claim 1 having more than two layers.

11. The memory of claim 1 wherein said layers are vertically stacked.

12. The memory of claim 11 wherein successive layers are spaced by an insulator.

13. The memory of claim 1 wherein said lines are vias extending vertically, said memory including a substrate having a surface, said first direction being substantially transverse to said surface.

14. A method comprising:
    forming a first and a second layer of memory material, said first and second layers spaced in a first direction; and
    forming a first and a second address line extending substantially in said first direction through said first and second layers.

15. The method of claim 14 including forming a third and fourth address line extending substantially transversely to said first direction.

16. The method of claim 15 including forming said third and fourth address lines in said first layer.

17. The method of claim 14 including forming a bicell structure.

18. The method of claim 14 wherein forming a first and second layer of memory material includes forming ferroelectric polymer memory material layers.

19. The method of claim 14 including forming more than two lines and more than two layers.

20. The method of claim 14 including forming said lines by forming metal filled vias.

21. The method of claim 14 including forming an insulator between said first and second layers.

22. A method comprising:
    addressing a polymer memory using first lines extending substantially in a first direction to address cells defined in at least two layers of memory material spaced from one another in said first direction, said lines extending through said at least two layers.

23. The method of claim 22 including using second lines extending substantially transversely to said first direction to address cells between said first and second lines.

24. The method of claim 23 including addressing a bicell between a second line and two adjacent first lines.

25. The method of claim 23 including addressing a cell in one layer by applying a potential to adjacent first and second lines.

26. The method of claim 22 wherein addressing includes addressing a ferroelectric polymer memory.

27. A system comprising:
    a controller;
    a wireless interface coupled to said controller; and
    a polymer memory coupled to said controller, said memory including a substrate having an upper surface, a plurality of first address lines extending in a first direction, at least two layers of memory material spaced from one another in said first direction, said lines extending through said at least two layers.

28. The system of claim 27 including third and fourth address lines extending substantially transversely to the first direction.

29. The system of claim 28 wherein said lines form a bicell structure.

30. The system of claim 29 wherein said interface includes a dipole antenna.

31. The system of claim 27 having more than two lines.

32. The system of claim 27 wherein said polymer memory is a ferroelectric polymer memory.

33. The memory of claim 27 having more than two layers.

34. The memory of claim 27 wherein said layers are vertically stacked.

35. The memory of claim 34 wherein successive layers are spaced by an insulating layer.

36. The memory of claim 27 wherein said lines are vias extending vertically, said substrate having an upper surface, said first direction being substantially transverse to said surface.

* * * * *

UNITED STATES PATENT AND TRADEMARK OFFICE
CERTIFICATE OF CORRECTION

| | | |
|---|---|---|
| PATENT NO. | : 7,184,289 B2 | Page 1 of 1 |
| APPLICATION NO. | : 10/712205 | |
| DATED | : February 27, 2007 | |
| INVENTOR(S) | : Ebrahim Andideh et al. | |

It is certified that error appears in the above-identified patent and that said Letters Patent is hereby corrected as shown below:

Column 5:
Line 2, "ferroelcctric" should be --ferroelectric--.

Signed and Sealed this

Fourteenth Day of August, 2007

JON W. DUDAS
*Director of the United States Patent and Trademark Office*